United States Patent
Zhang et al.

(10) Patent No.: US 12,519,489 B2
(45) Date of Patent: Jan. 6, 2026

(54) COMPRESSING CHECK NODE UNIT PARAMETERS IN LOW-DENSITY PARITY-CHECK CODES IN NON-VOLATILE MEMORY DEVICES

(71) Applicant: SK hynix Inc., Icheon-si (KR)

(72) Inventors: Fan Zhang, Fremont, CA (US); Meysam Asadi, San Jose, CA (US); Hongwei Duan, Cupertino, CA (US)

(73) Assignee: SK HYNIX INC., Icheon-si (KR)

( * ) Notice: Subject to any disclaimer, the term of this patent is extended or adjusted under 35 U.S.C. 154(b) by 189 days.

(21) Appl. No.: 18/410,782

(22) Filed: Jan. 11, 2024

(65) Prior Publication Data

US 2025/0233600 A1   Jul. 17, 2025

(51) Int. Cl.
H03M 13/11   (2006.01)

(52) U.S. Cl.
CPC ............... H03M 13/1111 (2013.01)

(58) Field of Classification Search
CPC .................................................. H03M 13/1111
See application file for complete search history.

(56) References Cited

U.S. PATENT DOCUMENTS

| | | | |
|---|---|---|---|
| 7,376,885 B2 | 5/2008 | Richardson et al. | |
| 9,548,764 B1 | 1/2017 | Chilappagari et al. | |
| 11,595,060 B2* | 2/2023 | Kim | H03M 13/116 |
| 2007/0283213 A1* | 12/2007 | Liao | H03M 13/1122 714/758 |
| 2013/0019141 A1* | 1/2013 | Wang | H03M 13/1171 714/763 |
| 2014/0223254 A1* | 8/2014 | Pisek | H03M 13/033 714/755 |
| 2014/0281787 A1* | 9/2014 | Wang | H03M 13/13 714/752 |
| 2016/0020783 A1* | 1/2016 | Yang | H03M 13/1108 714/752 |

* cited by examiner

*Primary Examiner* — Joseph D Torres
(74) *Attorney, Agent, or Firm* — Perkins Coie LLP

(57) ABSTRACT

Devices, systems, and methods for improving performance of an iterative decoder in a non-volatile memory are described. An example method includes receiving a noisy codeword that is based on a transmitted codeword generated from a low-density parity-check (LDPC) code, and performing, on the noisy codeword, a message passing algorithm. As part of the message passing algorithm, a check node is configured to receive each of multiple messages from a corresponding variable node connected to the check node. Then, the check node identifies, based on the multiple messages, check node unit (CNU) parameters, and maps a concatenation of the CNU parameters to a bit string that has a length less than that of the concatenation. The bit string, which is a compressed form of the CNU parameters, is stored in a CNU register, and used to process the noisy codeword to determine a candidate version of the transmitted codeword.

20 Claims, 8 Drawing Sheets

COMPRESSING CHECK NODE UNIT PARAMETERS IN LOW-DENSITY PARITY-CHECK CODES IN NON-VOLATILE MEMORY DEVICES

TECHNICAL FIELD

This patent document generally relates to non-volatile memory devices, and more specifically, to low-density parity-check codes used in non-volatile memory devices.

BACKGROUND

Data integrity is an important feature for any data storage device and data transmission. Use of strong error-correction codes (ECCs) is recommended for various types of data storage devices including NAND flash memory devices. Solid-state drives (SSDs) use multi-level NAND flash devices for persistent storage. However, multi-level NAND flash devices can be inherently unreliable and generally need to use ECCs to allow dramatic increase in data reliability at the expense of extra storage space and computational resources for ECC parity bits. There is a demand for ECCs that can provide low-complexity implementations.

SUMMARY

Embodiments of the disclosed technology relate to methods, systems, and devices that improve performance of a block of a memory device that uses a low-density parity check (LDPC) code. In an example, the memory device performance is improved by compressing the check node unit (CNU) parameters, thereby reducing the gate count and power consumption of the min-sum (MS) decoder of the memory device. The improved decoder, in the example of a penta-level cell (PLC) ECC, has a gate count reduced by more than 5%.

In one example, a method for improving a performance of an iterative decoder in a non-volatile memory is described. The method includes receiving a noisy codeword that is based on a transmitted codeword generated from a low-density parity-check (LDPC) code, and performing, on the noisy codeword for a first iteration, a message passing algorithm between a plurality of variable nodes and a plurality of check nodes that represent a parity matrix of the LDPC code. As part of the message passing algorithm, at least one check node of the plurality of check nodes is configured to receive each of a plurality of messages from a corresponding variable node of a subset of the plurality of variable nodes connected to the at least one check node. Herein, each of the plurality of messages comprises a sign and a magnitude. The at least one check node is further configured to identify, based on the plurality of messages, a set of check node unit (CNU) parameters. In an example, the set of CNU parameters includes (i) a first minimum value corresponding to a smallest magnitude amongst the plurality of messages, (ii) a second minimum value, greater than the first minimum value, corresponding to a second smallest magnitude amongst the plurality of messages, (iii) a first index associated with the first minimum value, and (iv) a second index associated with the second minimum value. After identifying the CNU parameters, the at least one check node maps a concatenation of the set of CNU parameters to a bit string that has a length less than a length of the concatenation, and stores the bit string in a CNU register. The method concludes with performing, on the noisy codeword for a remaining number of iterations, the message passing algorithm to determine a candidate version of the transmitted codeword.

In another example, the methods may be embodied in the form of an apparatus that includes a processor and a memory coupled to the processor.

In yet another example, the methods may be embodied in the form of processor-executable instructions and stored on a computer-readable program medium.

The subject matter described in this patent document can be implemented in specific ways that provide one or more of the following features.

DETAILED DESCRIPTION

Solid-state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use low-density parity-check (LDPC) codes to correct any bit-errors in pages read from NAND media. LDPC codes are used to ensure data integrity in storage systems that use the new generation of NAND flash memories.

General irregular LDPC codes have been gaining popularity due to them having the highest error correction capability (to meet a specific reliability requirement), and iterative decoders have been used to meet the throughput requirement. Iterative decoders for LDPC codes have a wide range of complexities. The two primary types of decoders are the low-complexity bit-flipping (BF) decoder with low error-correction capability and the high-complexity min-sum (MS) decoder with high error-correction capability. Furthermore, BF decoder performance (both correction and convergence) is known to be suboptimal for irregular codes (and especially for codes with a large portion of low column weights), and thus, embodiments of the disclosed technology provide implementations of the MS decoder that can support different compression techniques that advantageously reduce the gate count of the SSD (or memory device, in general).

This patent document first overviews an example of a non-volatile memory system in which an MS decoder can be implemented to decode irregular LDPC codes, and then describes methods, systems and devices to implement compression techniques that result in a power- and area-efficient MS decoder.

FIGS. 1-6 overview a non-volatile memory system (e.g., a flash-based memory, NAND flash) in which embodiments of the disclosed technology may be implemented.

Figure 1:
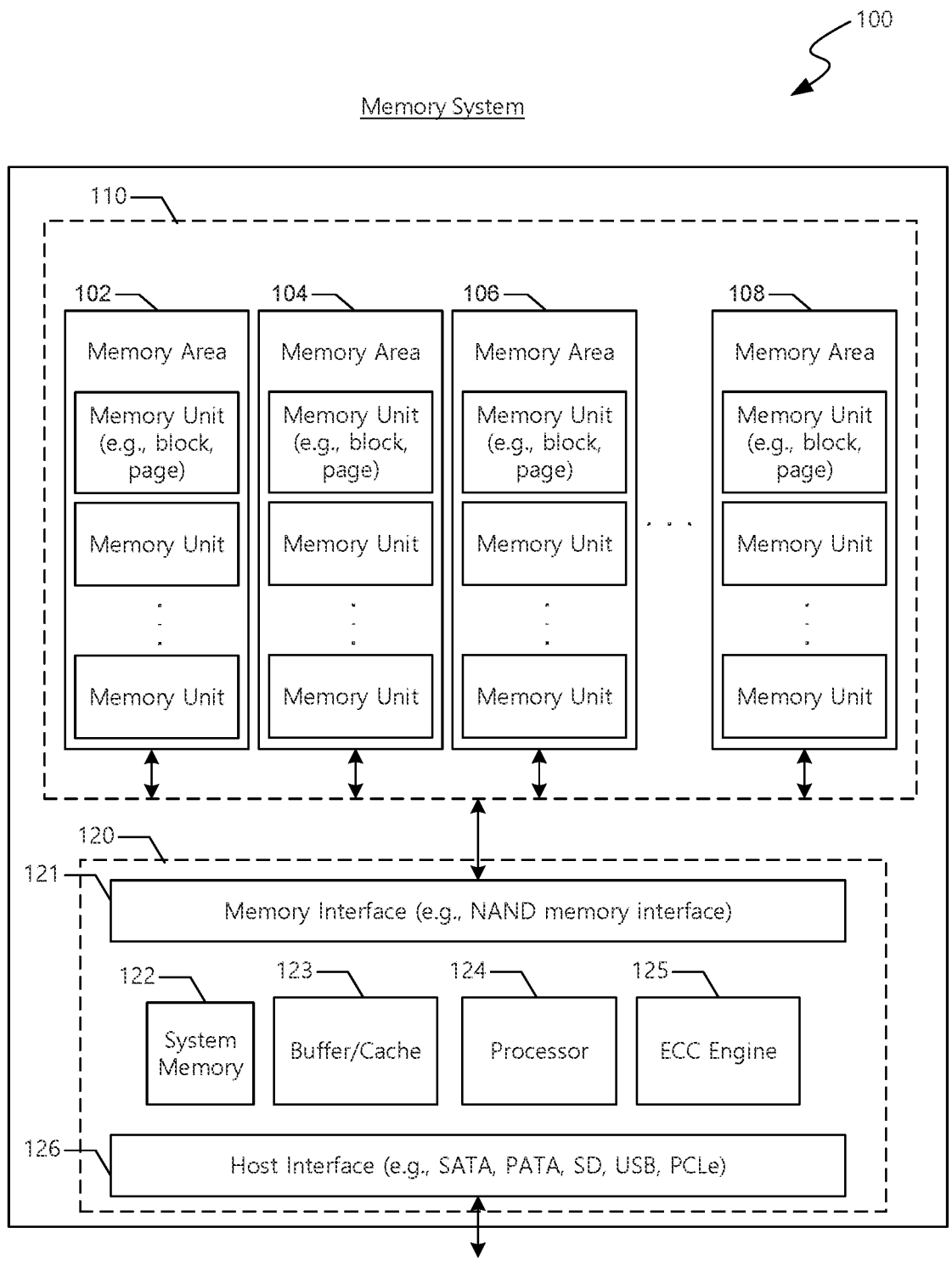
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
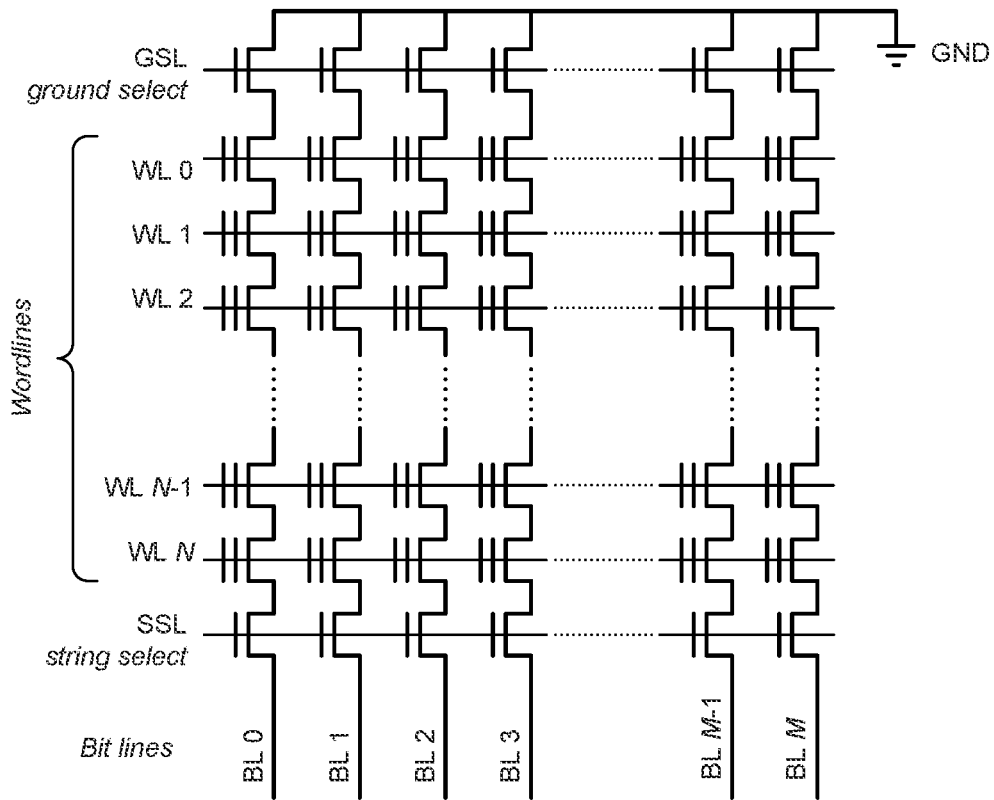
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
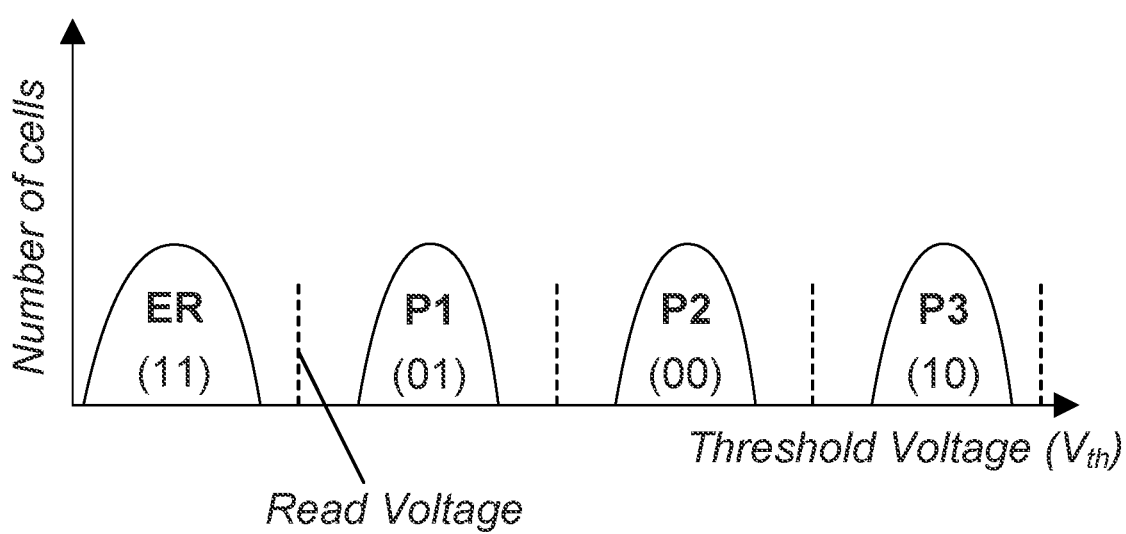
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a staircase program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECCO).

Figure 4:
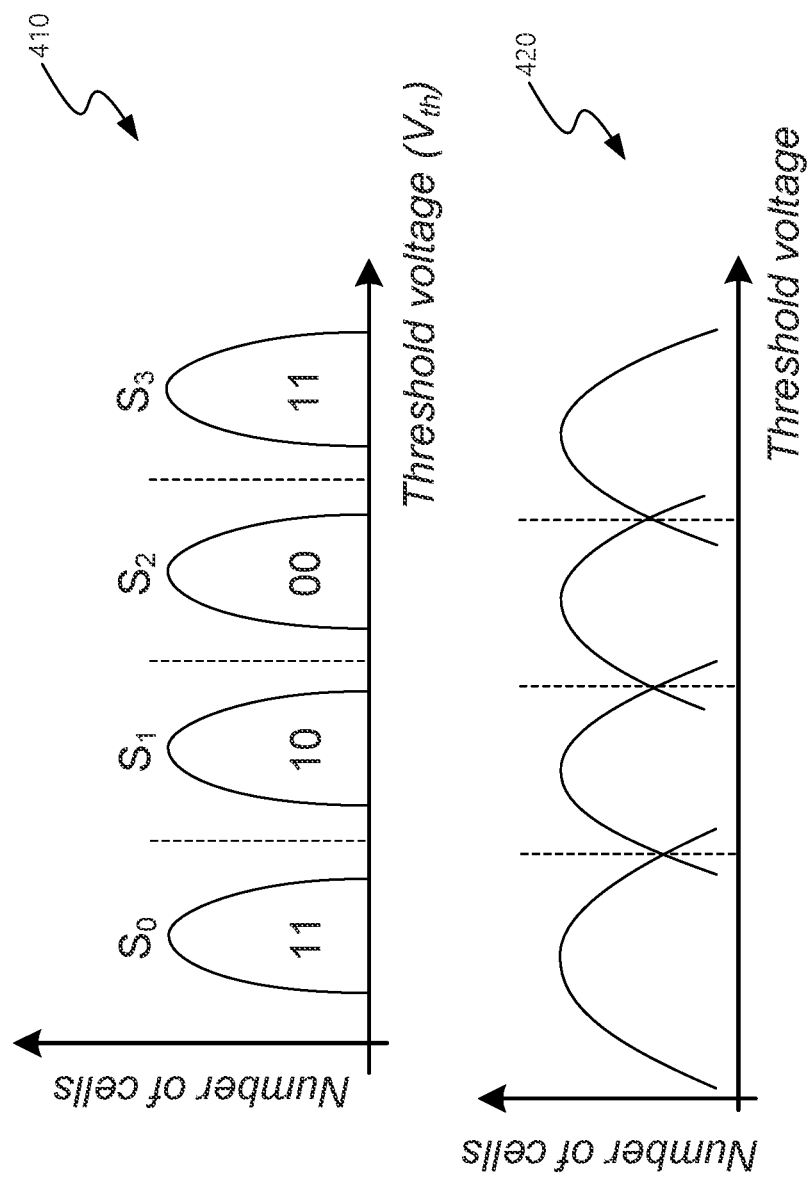
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
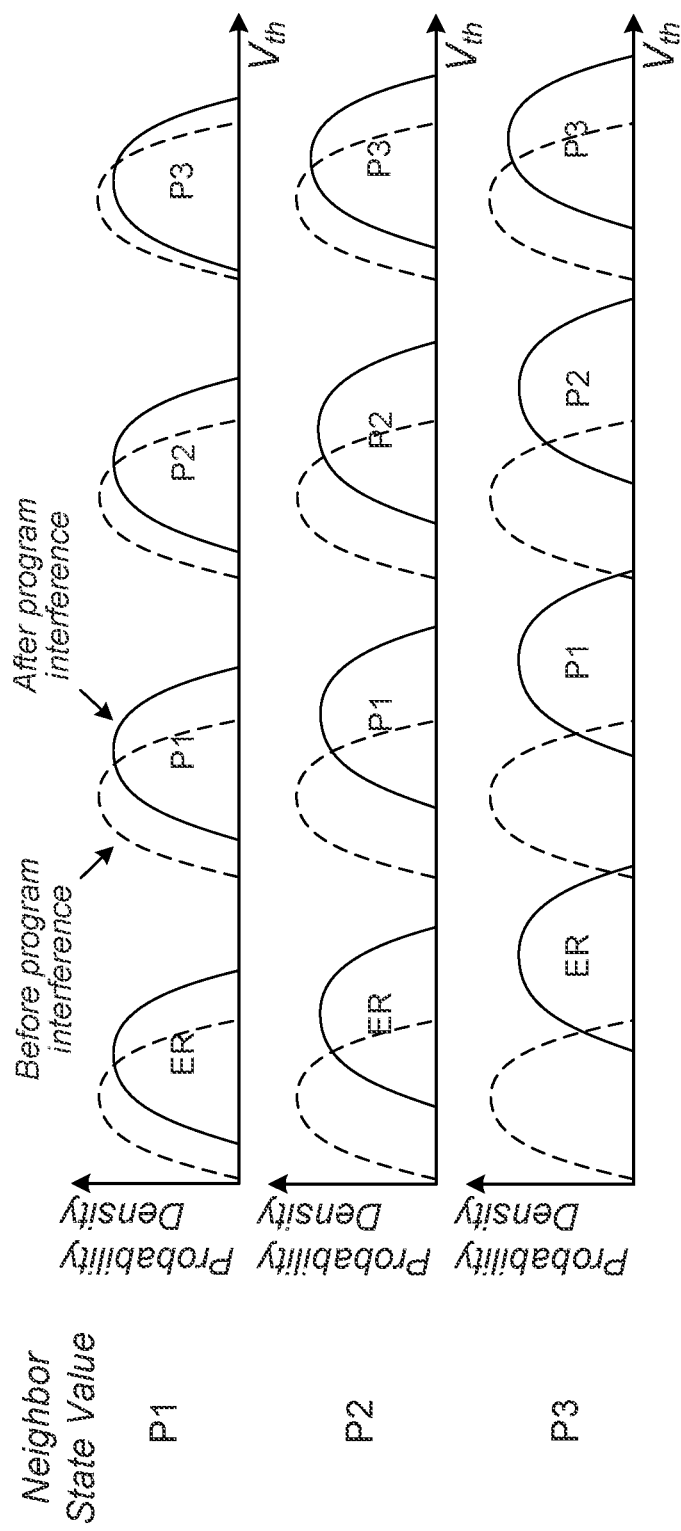
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
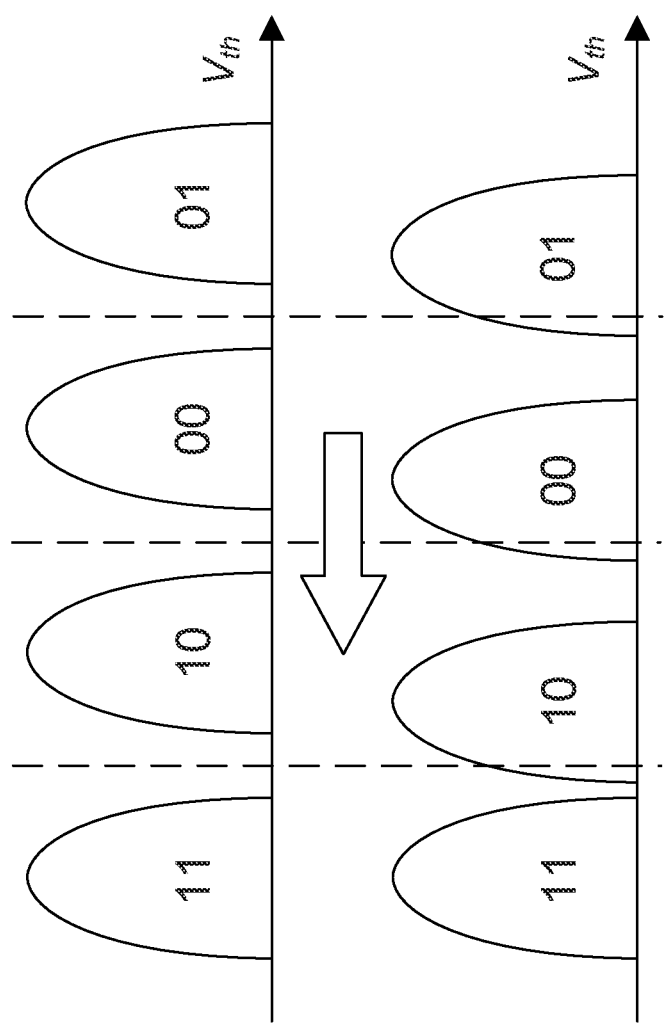
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6) and solid-state drive (SSD) applications, as discussed above, ECC engines include both the bit-flipping (BF) decoder and the min-sum (MS) decoder because they have different characteristics that support varying use cases. In SSD applications, which typically require high throughputs, an MS decoder with a vertically shuffled scheduling (VSS) architecture is generally used.

In an MS decoder with VSS architecture, all CNU information is required to be available and updated in a few cycles. In a typical implementation, each CNU stores a first minimum value (denoted min1) corresponding to a smallest magnitude amongst messages received from variable nodes connected to the CNU, a second minimum value, greater than the first minimum value, corresponding to a second smallest magnitude (denoted min2) amongst the messages received, a first index (denoted min1 index) of the corresponding variable node associated with the first minimum value, and a second index (denoted min2 index) of the corresponding variable node associated with the second minimum value.

For the typical implementation, the [min1, min2, min1 index, min2 index] information contains 18 bits of information. If 256 bits per cycle are processed, and the column weight is 5, the amount of CNU data needed per cycle is around 23,040 bits. Due to this high speed access to the CNU, CNU information is usually stored in registers, not in memory. The CNU registers consume around 50% of the gate count of the MS decoder and consume a significant amount of power as well. Thus, it is highly desirable to reduce the MS decoder's gate count in client and mobile applications, as well as in penta-level cell (PLC) PLC NAND that uses long LDPC codes (e.g., 16 KB) for cost saving. For an enterprise application, which is power limited, reducing the gate count of the MS decoder is also highly desirable. Embodiments of the disclosed technology provide several techniques to compress CNU information.

The example headings for the various sections below are used to facilitate the understanding of the disclosed subject matter and do not limit the scope of the claimed subject matter in any way. Accordingly, one or more features of one example section can be combined with one or more features of another example section. Furthermore, NAND flash terminology is used for the sake of clarity of explanation, but the techniques disclosed herein are not limited to NAND flash technology only, and may be used in other non-volatile memory devices.

Examples of Minimum Value Compression Methods

In some embodiments, the minimum value can be compressed to reduce the CNU gate count in a non-volatile memory device. The first minimum value, i.e., the minimum value amongst all the values received at a CNU, is critical to ensure an MS decoder's error correction performance, and the described embodiments do not compress this first minimum value. For the second minimum value and beyond, the described embodiments store the difference (or the delta) between the second minimum value and the first minimum value (because the former is always greater than the latter) in the CNU register. Storing the delta between minimum values, and not the second minimum value itself, reduces the storage requirement.

For example, if we assume min1 and min2 are 2 ("10" in binary) and 5 ("101" in binary), respectively, then instead of storing "101" (which is the second minimum value), the difference between the minimum values, i.e., 5−2=3 ("11" in binary) can be stored. Thus, in this case, storing the delta requires two bits, whereas storing the second minimum value requires three bits. Furthermore, if the delta exceeds a value of 3, the delta value is not updated (and does not require additional bits) because a ceiling value of 3 is assumed. Using a ceiling for the value, depending on the bit width used for the minimum values, only minimally affects the correction performance, but results in a reduced gate count.

In some embodiments, storing the delta value is applied to more than two values. For example, assuming min1, min2, and min3 are 3-bit values to be stored, then instead of store [min1, min2, min3] which requires 9 bits, the CNU registers stores min1 using 3 bits, the delta min2−min1 using 2 bits, and the delta min3−min2 using one bit. Thus, in this example, the minimum value compression results in 6 bits being stored (instead of 9 originally).

Examples of Minimum Index Compression Methods

In some embodiments, the index associated with the variable node from which the minimum value (or the second minimum value) is received can be compressed, either with the minimum value or independently. In existing decoders, each minimum value is associated with its own minimum index that ranges from 0 to d−1, where d is the weight of the check node.

In some embodiments, and in an example of joint and lossless compression, it is noted that the maximum check node weight is usually not power of two, so not all bit patterns in the minimum indices are fully utilized. Thus, in an example of compressing the values and indices, the concatenation of the parameters [min1, min2, min1_index, min2_index] is mapped by a mapper to a bit string, which achieves higher bit pattern utilization.

Figure 7:
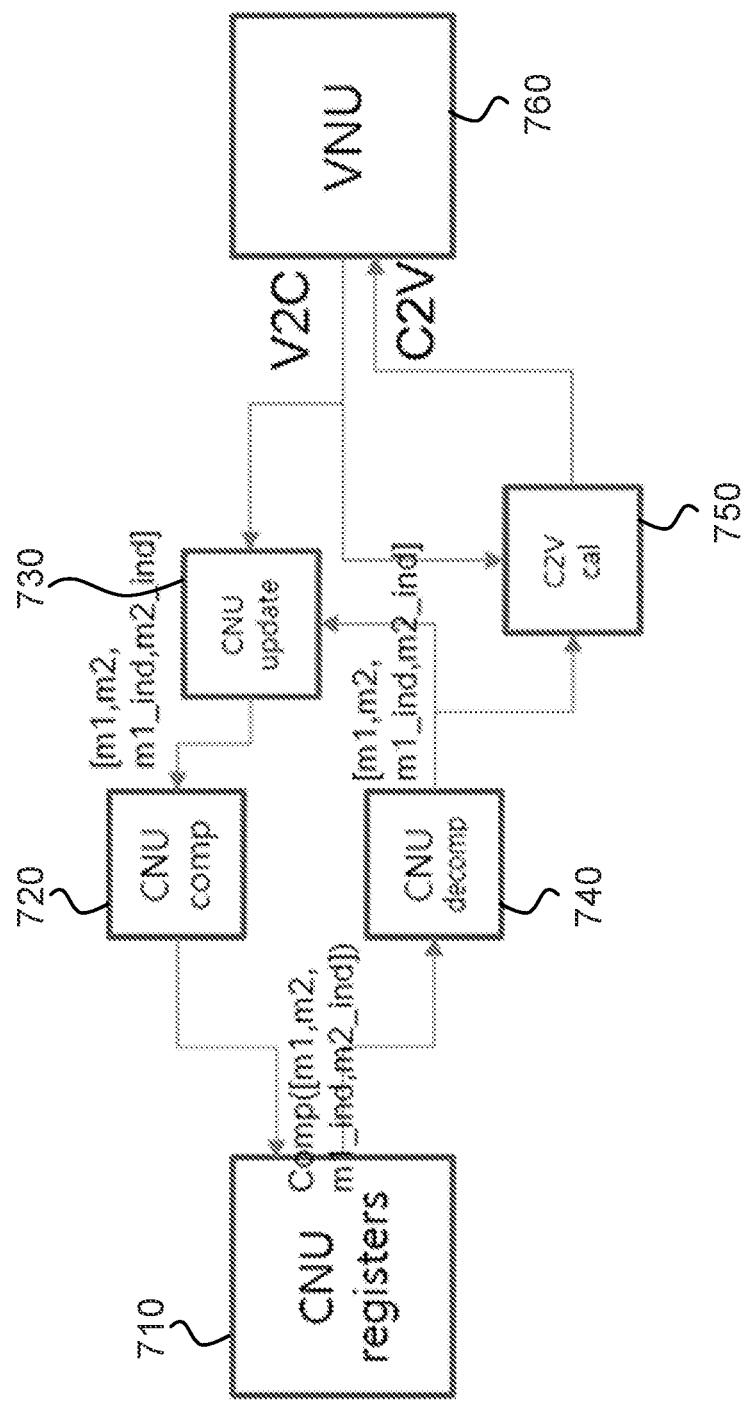
FIG. 7 is a block diagram illustrating an example architecture for variable node units (VNUs) and check node units (CNUs) that supports compression and decompression.

An example architecture for joint and lossless compression is shown in FIG. 7. As shown therein, the CNU registers 710 are associated with a check node unit (CNU) (not shown in FIG. 7) that is connected to multiple variable node units (VNUs), based on the parity-check matrix of the LDPC code, which include VNU 760. V2C messages from the VNU 760 are used for both the CNU update 730 and the C2V calculator 750. Upon completion of the CNU update 730, the minimum values (m1, m2) and associated indices (m1_ind, m2_ind) are sent to CNU compression 720, which is configured to implement one or more of the compression techniques described above. The compressed values are stored in the CNU registers 710. When these values are needed for the CNU update 730 and the C2V calculator 750, the values are first processed by CNU decompression 740 prior to their use.

In an example, it is assumed that the maximum row weight is 33, and the parameters [min1, min2, min3, min1_index, min2_index, min3_index] are stored per CNU. If the minimum values (min1, min2, min3) are 3-bit values and each of the indices requires 6 bits (because the maximum row weight is 33, and $2^6=64>33>2^5=32$), then in a conventional CNU, storing these parameters would require 3×(3+6)=27 bits per CNU. However, the total number of CNU configurations is equal to 8³×33³=18,399,744, which needs only 24.13 bits. Thus, a mapper that maps the uncompressed 27-bit string to a 25-bit string achieves around 7.5% saving in CNU registers. Herein, a demapper is needed to convert the compressed bit string back to original bit string for C2V message calculations and CNU updates.

In some embodiments, and in an example of lossy index compression, the minimum indices can be stored in the CNU registers after truncating or removing some of the bits therefrom. For example, if the maximum row weight is 33, the minimum indices may range from 0 ("000000" in binary) to 32 ("100000" in binary). In this example, the uncompressed CNU information is [001, 011, 010010, 100000], which corresponds to [min1, min2, min1_index, min2_index]. Herein, the MSB is removed from both min1_index and min2_index, which results in the compressed CNU information being [001, 011, 10010, 00000], which saves 2 bits out of 18 bits. When C2V messages are calculated, there will be at most one other V2C message that falsely matches with either min1_index or min2_index, and this may require additional decoding cycles to converge or some slight loss in correction (for a same maximum number of iterations).

Thus, the described techniques enables the choice of how many bits, and which bits, to remove (or truncate), and also which minimum index to apply the compression technique to, thereby providing a tradeoff between CNU savings and error correction performance.

In some embodiments, the bit (or bits) that is removed is based on the average index mismatch probability. For example, if the maximum row weight is 33, the bit patterns before compression can range from "000000", "000001", "000010", . . . "100000". If the LSB is removed, then it is evident that all but one bit pattern ("100000") have exactly one other bit pattern that could be mismatched with the compressed bit string. However, if the MSB is removed, then all but one bit pattern ("100000") have no other bit pattern that could cause a mismatch. The average (over all the checks) column weights associated with each bit pattern may also be considered because bit patterns with a higher average column weight can tolerate mismatches more than bit patterns with a lower average column weight.

Example Methods and Implementations of the Disclosed Technology

Figure 8:
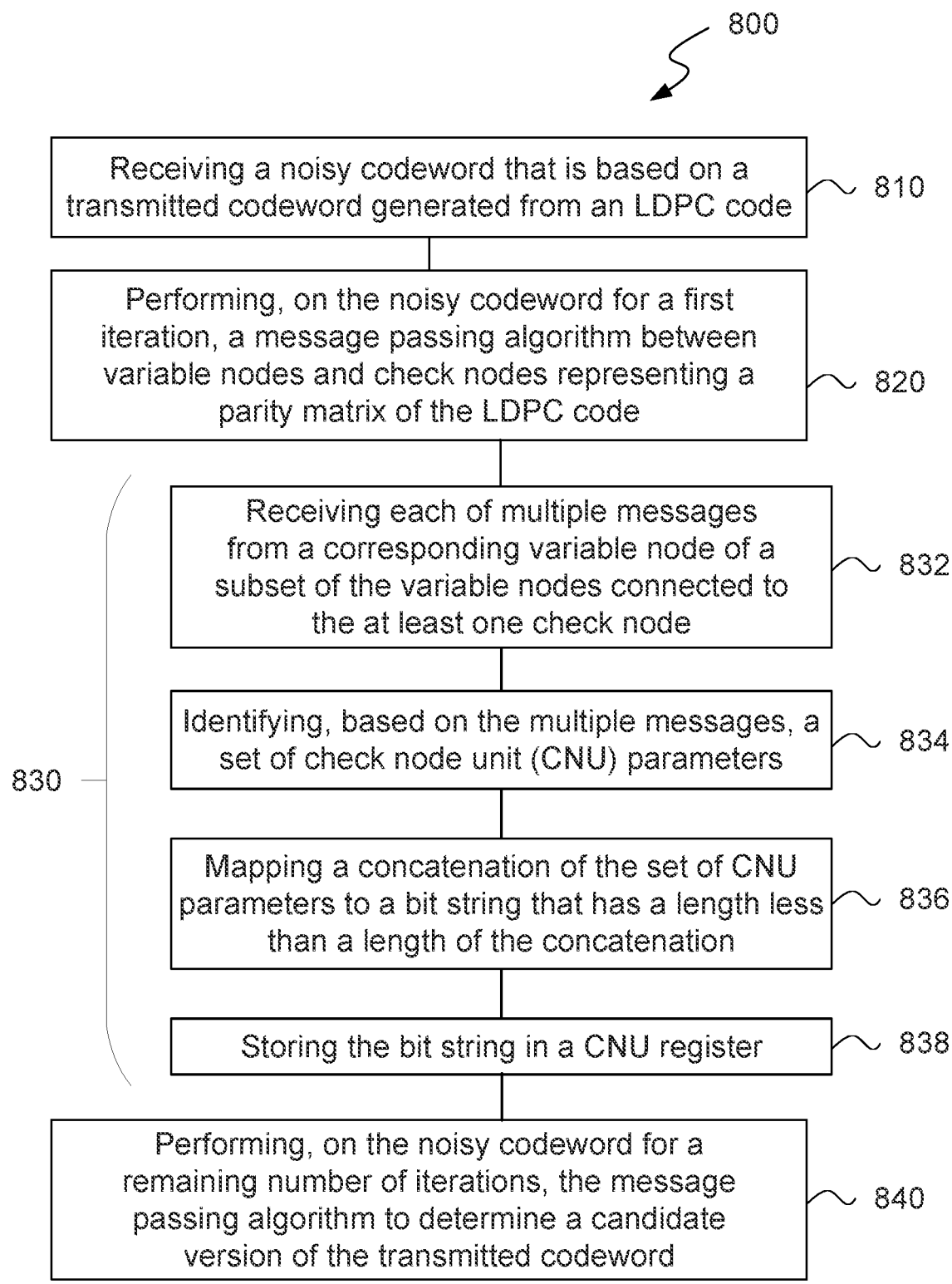
FIG. 8 illustrates a flowchart of an example method for improving the performance of an iterative decoder in a memory device.

FIG. 8 illustrates a flowchart of an example method 800 for improving a performance of an iterative decoder in a memory device. The method 800 includes, at operation 810, receiving a noisy codeword that is based on a transmitted codeword generated from a low-density parity-check (LDPC) code.

The method 800 includes, at operation 820, performing, on the noisy codeword for a first iteration, a message passing algorithm between variable nodes and check nodes that represent a parity matrix of the LDPC code.

The method 800 includes, at operation 830, performing, by at least one check node of the check nodes and as part of performing the message passing algorithm, operations 832 through 838. In example method 800, the operation 832 includes receiving each of multiple messages from a corresponding variable node of a subset of the variable nodes connected to the at least one check node. Herein, each of the messages comprises a sign and a magnitude.

In example method 800, the operation 834 includes identifying, based on the multiple messages, a set of check node unit (CNU) parameters. In an example, the set of CNU parameters includes (i) a first minimum value corresponding to a smallest magnitude amongst the multiple messages, (ii) a second minimum value, greater than the first minimum value, corresponding to a second smallest magnitude amongst the multiple messages, (iii) a first index associated with the first minimum value, and (iv) a second index associated with the second minimum value.

In example method 800, the operation 836 includes mapping a concatenation of the set of CNU parameters to a bit string that has a length less than a length of the concatenation (e.g., using CNU compression 720 in FIG. 7), and operation 838 includes storing the bit string in a CNU register (e.g., CNU register 710 in FIG. 7).

The method 800 includes, at operation 840, performing, on the noisy codeword for a remaining number of iterations, the message passing algorithm to determine a candidate version of the transmitted codeword.

In some embodiments, and as part of performing the message passing algorithm, the at least one check node of the check nodes is configured to retrieve, from the CNU register, the bit string, and demap the bit string to determine the smallest magnitude, the second smallest magnitude, the first index, and the second index (e.g., using CNU decompression 740 in FIG. 7).

In some embodiments, and as part of performing the message passing algorithm, the at least one check node of the check nodes is configured to perform, subsequent to demapping the bit string, a CNU update (e.g., using CNU update 730 in FIG. 7) and a calculation to generate a check node to variable node (C2V) message (e.g., using C2V calculator 750 in FIG. 7).

In some embodiments, the first index corresponds to a variable node of the subset of the variable nodes from which a message with the first minimum value is received by the at least one check node.

In some embodiments, a length of the first index is based on a largest check node weight amongst the check nodes.

In some embodiments, the largest check node weight is not a power of two.

In some embodiments, the message passing algorithm comprises a vertically shuffled scheduling (VSS) operation.

In some embodiments, the length of the bit string is based on a total number of CNU configurations. For example, the number of CNU configuration is based on the bit width used for storing the minimum values and indices, as well as the maximum row weight.

For a penta-level cell (PLC) ECC implementation, the total gate count is around 10M, and the described embodiments (e.g., method 800 discussed above) result in savings of around 700K in the gate count (around 7% savings).

Figure 9:
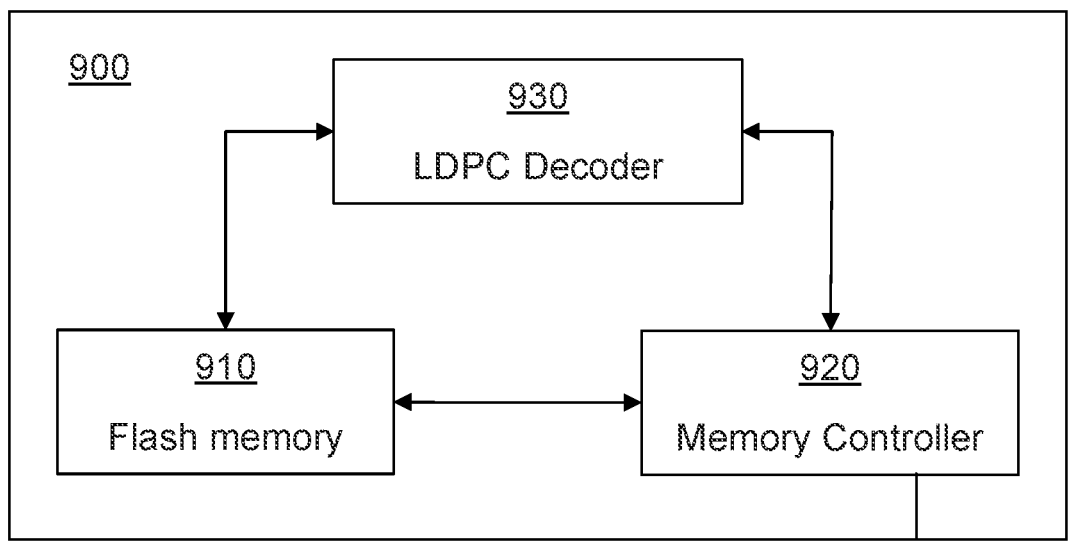
FIG. 9 is an example diagram illustrating a storage device that can be configured to implement the described embodiments.

FIG. 9 is an example diagram illustrating a storage device that can be configured to implement the described embodiments. Referring to FIG. 9, a data storage device 900 may include a flash memory 910, a memory controller 920, and an LDPC decoder 930. The memory controller 920 may control the flash memory 910 and the LDPC decoder 930 in response to control signals input from the outside of the data storage device 900. In the data storage device 900, the flash memory 910 may be configured the same or substantially the same as a nonvolatile memory device. That is, the flash memory 910 may read data from selected memory cells using different read voltages to output it to the memory controller 920.

In some embodiments, the data storage device 900 may be a memory card device, an SSD device, a multimedia card device, an SD card, a memory stick device, an HDD device, a hybrid drive device, or an USB flash device. For example, the data storage device 900 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a performance of an iterative decoder in a non-volatile memory, comprising:

receiving a noisy codeword that is based on a transmitted codeword generated from a low-density parity-check (LDPC) code;

performing, on the noisy codeword for a first iteration, a message passing algorithm between a plurality of variable nodes and a plurality of check nodes that represent a parity matrix of the LDPC code, wherein, as part of performing the message passing algorithm, at least one check node of the plurality of check nodes is configured to:

receive each of a plurality of messages from a corresponding variable node of a subset of the plurality of variable nodes connected to the at least one check node, each of the plurality of messages comprising a sign and a magnitude, identify (i) a first minimum value corresponding to a smallest magnitude amongst the plurality of messages, (ii) a second minimum value, greater than the first minimum value, corresponding to a second smallest magnitude amongst the plurality of messages, (iii) a first index associated with the first minimum value, and (iv) a second index associated with the second minimum value, map a concatenation of the smallest magnitude, the second smallest magnitude, the first index, and the second index to a bit string, wherein a length of the bit string is less than a length of the concatenation, and store the bit string in a check node unit (CNU) register; and performing, on the noisy codeword for a remaining number of iterations, the message passing algorithm to determine a candidate version of the transmitted codeword.

2. The method of claim 1, wherein, as part of performing the message passing algorithm, the at least one check node of the plurality of check nodes is configured to:

retrieve, from the CNU register, the bit string; and demap the bit string to determine the smallest magnitude, the second smallest magnitude, the first index, and the second index.

3. The method of claim 2, wherein, as part of performing the message passing algorithm, the at least one check node of the plurality of check nodes is configured to:

perform, subsequent to demapping the bit string, a CNU update and a calculation to generate a check node to variable node (C2V) message.

4. The method of claim 1, wherein the first index corresponds to a variable node of the subset of the plurality of variable nodes from which a message with the first minimum value is received by the at least one check node.

5. The method of claim 1, wherein a length of the first index is based on a largest check node weight amongst the plurality of check nodes.

6. The method of claim 5, wherein the largest check node weight is not a power of two.

7. The method of claim 1, wherein the message passing algorithm comprises a vertically shuffled scheduling (VSS) operation.

8. The method of claim 1, wherein the length of the bit string is based on a total number of CNU configurations.

9. A system for improving a performance of an iterative decoder in a non-volatile memory, comprising:

a processor and a memory including instructions stored thereupon, wherein the instructions upon execution by the processor cause the processor to:

receive a noisy codeword that is based on a transmitted codeword generated from a low-density parity-check (LDPC) code;

perform, on the noisy codeword for a first iteration, a message passing algorithm between a plurality of variable nodes and a plurality of check nodes that represent a parity matrix of the LDPC code, wherein, as part of performing the message passing algorithm, at least one check node of the plurality of check nodes is configured to:

receive, each of a plurality of messages from a corresponding variable node of a subset of the plurality of variable nodes connected to the at least one check node, each of the plurality of messages comprising a sign and a magnitude, identify (i) a first minimum value corresponding to a smallest magnitude amongst the plurality of messages, (ii) a second minimum value, greater than the first minimum value, corresponding to a second smallest magnitude amongst the plurality of messages, (iii) a first index associated with the first minimum value, and (iv) a second index associated with the second minimum value, map a concatenation of the smallest magnitude, the second smallest magnitude, the first index, and the second index to a bit string, wherein a length of the bit string is less than a length of the concatenation, and store the bit string in a check node unit (CNU) register; and perform, on the noisy codeword for a remaining number of iterations, the message passing algorithm to determine a candidate version of the transmitted codeword.

10. The system of claim 9, wherein, as part of performing the message passing algorithm, at least one check node of the plurality of check nodes is configured to:
retrieve, from the CNU register, the bit string;
demap the bit string to determine the smallest magnitude, the second smallest magnitude, the first index, and the second index; and
perform, subsequent to demapping the bit string, a CNU update and a calculation to generate a check node to variable node (C2V) message.

11. The system of claim 9, wherein the first index corresponds to a variable node of the subset of the plurality of variable nodes from which a message with the first minimum value is received by the at least one check node.

12. The system of claim 9, wherein a length of the first index is based on a largest check node weight amongst the plurality of check nodes, and wherein the largest check node weight is not a power of two.

13. The system of claim 9, wherein the message passing algorithm comprises a vertically shuffled scheduling (VSS) operation.

14. The system of claim 9, wherein the length of the bit string is based on a total number of CNU configurations.

15. A non-transitory computer-readable storage medium having instructions stored thereupon for improving performance of an iterative decoder in a non-volatile memory device, comprising:

instructions for receiving a noisy codeword that is based on a transmitted codeword generated from a low-density parity-check (LDPC) code;

instructions for performing, on the noisy codeword for a first iteration, a message passing algorithm between a plurality of variable nodes and a plurality of check nodes that represent a parity matrix of the LDPC code, wherein, as part of performing the message passing algorithm, at least one check node of the plurality of check nodes is configured to:

receive, each of a plurality of messages from a corresponding variable node of a subset of the plurality of variable nodes connected to the at least one check node, each of the plurality of messages comprising a sign and a magnitude, identify (i) a first minimum value corresponding to a smallest magnitude amongst the plurality of messages, (ii) a second minimum value, greater than the first minimum value, corresponding to a second smallest magnitude amongst the plurality of messages, (iii) a first index associated with the first minimum value, and (iv) a second index associated with the second minimum value, map a concatenation of the smallest magnitude, the second smallest magnitude, the first index, and the second index to a bit string, wherein a length of the bit string is less than a length of the concatenation, and store the bit string in a check node unit (CNU) register; and instructions for performing, on the noisy codeword for a remaining number of iterations, the message passing algorithm to determine a candidate version of the transmitted codeword.

16. The non-transitory computer-readable storage medium of claim 15, wherein, as part of performing the message passing algorithm, at least one check node of the plurality of check nodes is configured to:
retrieve, from the CNU register, the bit string; and
demap the bit string to determine the smallest magnitude, the second smallest magnitude, the first index, and the second index.

17. The non-transitory computer-readable storage medium of claim 16, wherein, as part of performing the message passing algorithm, the at least one check node of the plurality of check nodes is configured to:
perform, subsequent to demapping the bit string, a CNU update and a calculation to generate a check node to variable node (C2V) message.

18. The non-transitory computer-readable storage medium of claim 15, wherein the first index corresponds to a variable node of the subset of the plurality of variable nodes from which a message with the first minimum value is received by the at least one check node.

19. The non-transitory computer-readable storage medium of claim 15, wherein a length of the first index is based on a largest check node weight amongst the plurality of check nodes, and wherein the largest check node weight is not a power of two.

20. The non-transitory computer-readable storage medium of claim 15, wherein the length of the bit string is based on a total number of CNU configurations.

* * * * *